(12) United States Patent
Gaillard et al.

(10) Patent No.: US 8,324,073 B2
(45) Date of Patent: Dec. 4, 2012

(54) METHOD FOR PRODUCING AN ELECTRO-MECHANICAL MICROSYSTEM

(75) Inventors: Frederic-Xavier Gaillard, Voiron (FR); Fabrice Nemouchi, Moirans (FR)

(73) Assignee: Comissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/045,040

(22) Filed: Mar. 10, 2011

(65) Prior Publication Data
US 2011/0221015 A1    Sep. 15, 2011

(30) Foreign Application Priority Data
Mar. 10, 2010 (FR) ..................... 10 51715

(51) Int. Cl.
    *H01L 21/76* (2006.01)
(52) U.S. Cl. ................. 438/409; 438/459; 257/E21.502
(58) Field of Classification Search .................. 438/402, 438/409, 411, 422; 257/E21.483, E21.536
See application file for complete search history.

(56) References Cited

U.S. PATENT DOCUMENTS
7,851,248 B2    12/2010    Kronmueller et al.

OTHER PUBLICATIONS

Mehmet Ozgur et al., "Optimization of Backside Micromachined CMOS Inductors for RF Applications," IEEE International Symposium on Circuits and Systems, 2000, pp. V-185-V-188.
Nim H. Tea et al., "Hybrid Postprocessing Etching for CMOS-Compatible MEMS," Journal of Microelectromechanical Systems, vol. 6, No. 4, Dec. 1997, 5 pages.
M Saadaoui et al., "Dry followed by wet backside etching processes for micromachined endfire antennae," Journal of Micromechanics and Microengineering, 2005, pp. S65-S71.
Pen-Li Huang et al., "Micromachined 50 GHz/60 GHz Phi Filters by CMOS Compatible ICP Deep Trench Technology," Microwave and Optical Technology Letters, vol. 50, No. 12, Dec. 2008, pp. 3142-3146.
French Preliminary Search Report issued Dec. 17, 2010, in French 1051715, filed Mar. 10, 2010 (with English Translation of Category of Cited Documents).

*Primary Examiner* — Cheung Lee
(74) *Attorney, Agent, or Firm* — Oblon, Spivak, McClelland, Maier & Neustadt, L.L.P.

(57) ABSTRACT

A method for producing an electro-mechanical microsystem including movable mechanical parts, said method including a phase of releasing at least one movable mechanical part, wherein the releasing phase includes the following steps: formation of at least one porous zone in a first wafer of a semiconductor material; formation of at least a pattern of a material that makes at least one movable mechanical part on a front face of the first wafer and at least a partial encapsulation of the pattern in a sacrificial layer; release of the movable mechanical part through a rear face of the first wafer throughout the porous zone, using a solvent of the sacrificial layer.

18 Claims, 4 Drawing Sheets

METHOD FOR PRODUCING AN ELECTRO-MECHANICAL MICROSYSTEM

TECHNICAL FIELD OF THE INVENTION

The present invention relates to the production of electro-mechanical microsystems in general, and more particularly describes a method enabling the release of the movable parts of such a microsystem.

STATE OF THE ART

In the 1970s, electro-mechanical microsystems were developed and now see their scope extend significantly. As it is mainly derived from the manufacturing technology of integrated circuits and that of microelectronics in general, the production of such microsystems uses all the physico-chemical techniques developed during the five decades which elapsed since the first integrated circuits were manufactured. Generally designated by the acronym MEMS for "Micro Electro-Mechanical Systems", or even NEMS when their dimensions is in nanometers ($10^{-9}$ meter) and no longer in micrometers ($10^{-6}$ meters), the methods for producing such microsystems may have to vary very significantly because of the very large range of applications considered. More particularly, for producing a microsystem including mechanical parts which must be free to move, as for example in an accelerometer which is fitted on each airbag in motor vehicles, the production steps required for their release will have to be provided for. This release imposes the dissolution of a sacrificial layer surrounding the movable parts generally made of silicon, with this material, originally used worldwide for the production of integrated circuits, also being used for the production of MEMS because of its excellent mechanical properties. Since they are based on technologies which have a lot in common and the same material, silicon, MEMS can then be integrated in logic circuits, more particularly those of the CMOS "Complementary Metal Oxide Semiconductor" type, to provide sophisticated hybrid functions during the same manufacturing process.

Figure 1:
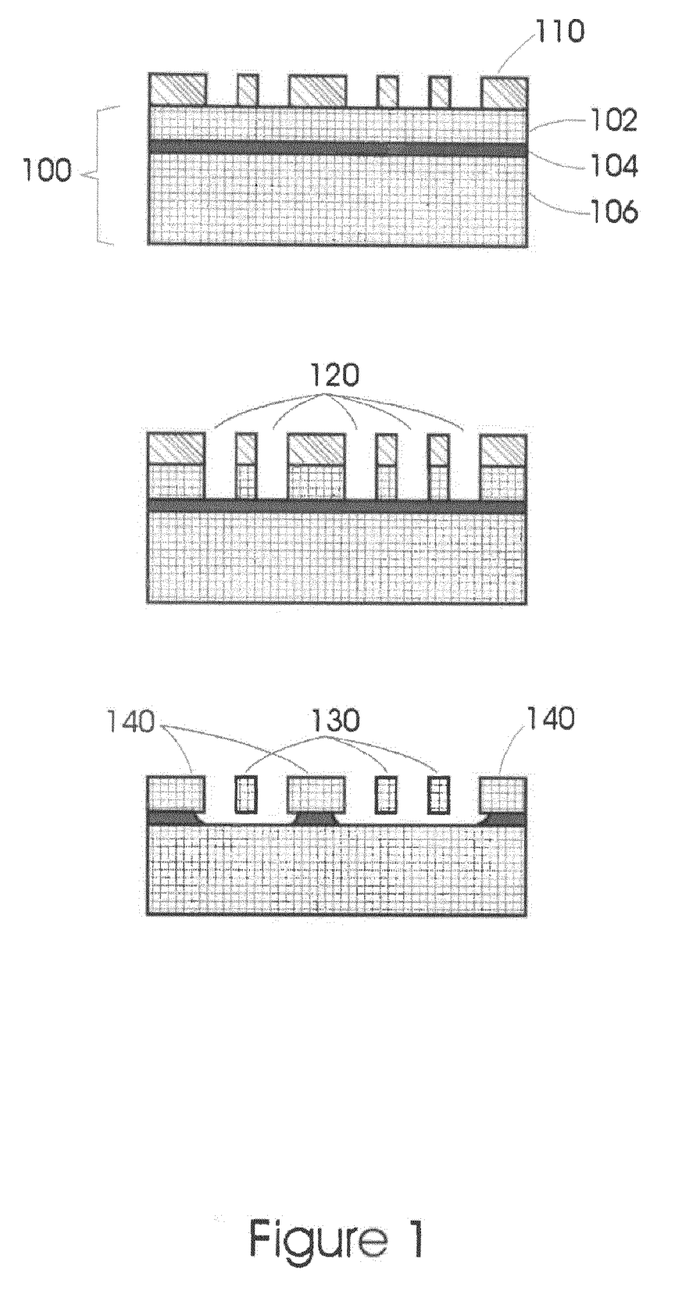
FIG. 1 illustrates a known method for releasing the movable parts of an electro-mechanical microsystem from the upper surface of the device.

A well-known method to execute the etching of MEMS in a substrate generally made of silicon, with a view to releasing the parts which must be movable, uses a so-called "deep reactive ion etching" technique. It is most often designated by the acronym DRIE, and it is a highly anisotropic etching process, which makes it possible to execute deep trenches into silicon with a very high height/width ratio. When combined with the use of sophisticated silicon wafers also called SOI, for "Silicon On Insulator", this method makes it possible to release movable parts after the dissolution of the under-laying insulating layer 104 as can be seen in FIG. 1. SOI wafers 100 are produced using a costly method which leads, as suggested by its name, to the production of a sophisticated basic material including a thin layer of monocrystalline silicon 102, wherein the devices to be produced are executed, the thin layer being separated by an insulator 104, most often silicon oxide ($SiO_2$), from a thicker silicon substrate 106 giving the assembly a sufficient mechanical rigidity.

Starting from this basic material, an SOI wafer 100, the parts to be released and the fixed anchoring zones are defined by the conventional photolithographic methods after the deposition of a layer of photoresist 110. Trenches are then etched 120 into the whole thickness of the monocrystalline thin layer by DRIE. After the removal of the resin, the silicon oxide is dissolved, thus releasing the mobile parts 130 without significantly affecting the wider anchoring zones 140.

The basic material is costly and, in addition, the method briefly described hereabove implies that the release of the movable parts is executed from the upper face of the device. To produce sophisticated hybrid devices including a large logic part, the latter shall have to be previously produced in the form of, for example, CMOS circuits in the upper monocrystalline layer 102 of the SOI wafer. Then, the problem of protecting the logical part, and more generally the parts of the device which have already been executed whatever the nature thereof, during the operations of etching the trenches by DRIE and releasing the movable parts by dissolution of the silicon oxide generally using hydrofluoric acid. These operations are potentially extremely destructive for the already executed parts of the hybrid device.

Then, one object of the invention is to provide a new method for releasing the movable parts of an MEMS device which totally or partially meets the difficulties mentioned above. More particularly, one object of the invention is to disclose a method which does not require the release of the movable parts of an MEMS device to be executed through the face from which the components, whether mechanical or other components, have been produced.

Another object of the invention is to provide for a new structure of the MEMS device, by providing for a fluid access to the parts of the MEMS through porous zones. This access can be used for operating the MEMS, for the passage of gas or liquids.

The other objects, characteristics and advantages of the present invention will appear upon reading the following description and the accompanying drawings. It should be noted that other advantages can be integrated therein.

SUMMARY OF THE INVENTION

The invention describes a method for releasing movable mechanical parts of an electro-mechanical microsystem. The method is characterised in that one or several porous zones are formed in a wafer, preferably on the front face of a first wafer of a semiconductor material. One pattern or patterns of a material suitable for making the movable mechanical parts of the electro-mechanical microsystem are then formed on the front face of the first wafer at the level of the porous zones. The patterns are encapsulated in a sacrificial layer. Then, in an aspect of the invention, a layer of a material withstanding an attack by a solvent of the sacrificial layer is advantageously deposited. Advantageously, a transfer by bonding the front face of the first wafer onto a second wafer is carried out and is followed by a thinning from the rear face of the first wafer until the porous zones are detected. The release of the movable mechanical parts is then carried out through the rear face of the first wafer, through the porous zones using a solvent of the sacrificial layer.

In other aspects of exemplary embodiments of the invention, the method can further include the optional, alternative or cumulative following characteristics:
  prior to releasing the movable mechanical part,
  a transfer by bonding the front face of the first wafer onto a second wafer;
  a thinning from the rear face of the first wafer until the porous zone is detected, are executed.
  the sacrificial layer covers at least partially the porous zone.
  the sacrificial layer is interrupted by at least one barrier able to define at least partially one zone to be released about the movable mechanical part, said barrier being made of a material withstanding an attack by a solvent of the sacrificial layer.

the sacrificial layer is made of an oxide of the semiconductor material making up the first wafer.

the material suitable for making the pattern of the mechanical part is monocrystalline silicon.

the monocrystalline silicon of the pattern is obtained by a selective epitaxial growth from the first wafer which is also made up of monocrystalline silicon.

one oxide pattern is formed on the porous zone, said oxide pattern belonging to the sacrificial layer, and the epitaxial growth is so executed as to cover the oxide pattern.

the monocrystalline silicon of the pattern is obtained by transfer of an epitaxial layer formed on a third wafer of the monocrystalline silicon after the formation of a layer of porous silicon on the surface thereof.

a deposition of an oxide layer is made on the first wafer upon completion of the formation of the porous zone and the deposition of oxide is made on the third wafer upon completion of the formation of the epitaxial layer for the assembling thereof by bonding.

a step of fracturing the third wafer at the level of the layer of porous silicon and a step of polishing so as to leave a continuous layer of monocrystalline silicon on the surface of the first wafer.

at least one trench filled with oxide is formed orthogonally to the porous zone, followed by a deposition of oxide on the whole surface of the first wafer so as to make up, with the pattern or the layer of oxide previously formed on the porous zone, the sacrificial layer encapsulating the movable mechanical part.

the production of at least one electronic component of the electro-mechanical microsystem in the layer of monocrystalline silicon.

the material able to make up the pattern of the movable mechanical part is polycrystalline silicon.

the execution of steps of production of electronic components participating in the electro-mechanical microsystem above the layer of a material withstanding an attack by a solvent of the sacrificial layer.

a step of deposition onto a rear face opposite the front face of the first wafer of a material able to make the electro-mechanical microsystem tight by obstruction of the porous zone.

several porous zones and/or several patterns of movable mechanical parts are formed. The invention also describes an electro-mechanical microsystem including porous zones intended to enable the release of the movable mechanical parts.

Another aspect of the invention is a method for producing an electro-mechanical microsystem including a superposition of a wafer of a semiconductor material, a sacrificial layer and a layer of a material withstanding an attack by a solvent of the sacrificial layer and further including one movable mechanical part at least partially encapsulated in the sacrificial layer, characterised in that it further includes at least one porous zone formed in the wafer and going through the thickness of said wafer to enable a fluid access to the sacrificial layer.

The invention also discloses an electro-mechanical system including a wafer made of a semiconductor material and a layer defining a housing chamber of at least one movable mechanical part, characterised in that it includes at least one porous zone formed in the water and going though the thickness of said wafer to enable a fluid access to the chamber.

BRIEF DESCRIPTION OF THE FIGURES

The aims, the objects as well as the characteristics and the advantages of the invention will stand out of the detailed description of one embodiment thereof, which is illustrated by the following accompanying drawings, wherein the successive phases of the method are shown from top to bottom in a column on the left, and then from top to bottom in a column on the right.

The enclosed drawings are given as examples and are not as a limitation of the invention. Identical references in the drawings refer to similar operations or elements, whatever the figure.

DETAILED DESCRIPTION OF THE INVENTION

The following description is made in the context of a complete release of several movable parts, but this case is not limitative. This may be a partial release or the release of only one mechanical part. In addition, the term movable part means the capacity of said part to be modified as regards its position. This mobility must be understood in the broadest sense and may be only partial, for example when releasing a freedom of movement only by a bending deformation without the part being totally free to move.

Figure 2:
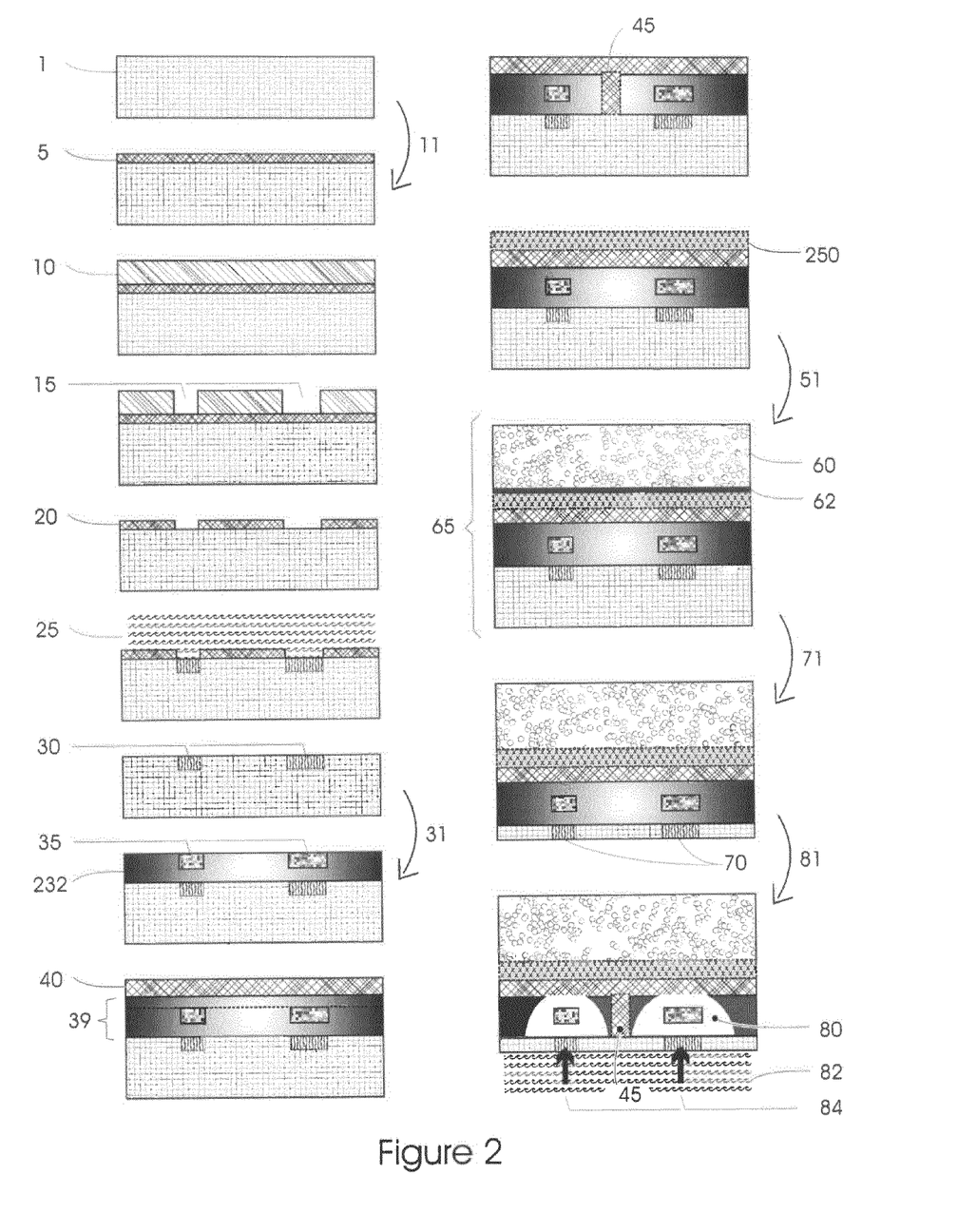
FIG. 2 illustrates a first way to implement the invention, wherein the movable parts made of polycrystalline silicon are released by the lower face of the device through porous silicon zones.

FIG. 2 illustrates a first way to implement the invention, wherein the movable parts are made of polycrystalline silicon.

The method of the invention starts from the base material of the whole microelectronics industry, i.e. a homogeneous wafer of a generally low doped monocrystalline silicon 1 having a sufficient thickness to be rigid and easily handled. The wafer is often designated by the English name "wafer" and constitutes the substrate from which the devices will be produced. For this purpose, the upper face of the wafer is generally receives an optical quality polishing. This is conventionally, and only from this face, that the devices are executed.

It should be noted that in the whole following description of the invention, the upper face, i.e. the face of the starting wafer from which the devices, whether mechanical or others, are produced can also be designated as the front face as opposed to the other face of the wafer which is designated as being the lower face or rear face of the starting wafer.

The first step 11 of the method of the invention consists in creating zones of porous silicon 30 on the upper surface of the wafer. These zones will be used at the end of the method to release, through the pores, the movable parts of the MEMS located at the level of these zones. The porosification of silicon not restrictively consists in implementing known techniques which are very briefly summarised hereinafter.

Electro-chemically obtaining porous silicon from monocrystalline silicon is known since the 50s. Porosification is obtained by an anodic dissolution in presence of hydrofluoric acid (HF). Suitable devices must be used to process each silicon wafer 1. The zones to be porosified must be previously determined on the upper surface of the wafer. For this purpose, a layer of a protective material resisting the anodic dissolution is first deposited 5. This is typically a layer of silicon nitride (Si3N4). After the deposition of a photoresist layer 10, the zones to be porosified are defined by photolithography 15, which makes it possible to etch the patterns into the nitride layer 20. After removing the resin, the upper surface of the wafer can be contacted with an aqueous medium of hydrofluoric acid 25 in order to porosify the zones which are not protected by silicon nitride. Then, a potential difference or a continuous current is imparted between a cathode immersed in the aqueous solution of hydrofluoric acid and an anode which is in electric contact with the lower face of the wafer to be porosified. The hydrofluoric acid content of the aqueous medium, the current value imparted and the anodisation time are, amongst others, parameters which make it possible to control the characteristics of the desired porous layer. An illumination of the aqueous medium gives an additional optional control means of the characteristics of the porous layer, if so required.

The thickness of the porous zones to be produced, as well as the characteristics thereof, can be extremely different according to the particular applications of the invention. More particularly, the size of the pores produced may vary in a large range of values, typically from a few nanometers to a few micrometers on a thickness between, typically, approximately one hundred nanometers and a few dozens micrometers. After removing the silicon nitride which was used as a protection, the initial silicon wafer is thus covered with porous zones 30 matching the patterns etched in nitride and in a depth controlled by the previous anodic dissolution operation.

It should be noted that the words "porous zone" are not limitative for any shape, dimension or pattern of said zone. In addition, the porous zone may be a complete layer and not only parts of a layer.

When the porous zones are formed, the production of the microsystems goes on with step 31 of creating the mechanical parts which, in this first implementation of the invention, are made of polycrystalline silicon patterns. Such patterns 35, aligned on the porous zones and formed on a first oxide layer 232, are finally totally encapsulated in sacrificial oxide layers, forming a whole assembly 39, which will be dissolved for releasing the movable parts, as explained hereinunder. The method to obtain such patterns and this vertical structure implements techniques which are well-known to the persons skilled in the art. More particularly, all the means and techniques for depositing silicon oxide and polycrystalline silicon which have been used for a long time in microelectronics can be applied. The patterns can also be defined by the conventional techniques of photolithography and etching. The surface condition, more particularly between the first and the second deposition of oxide, to form the assembly 39 can require a polishing, for example of the chemical-mechanical or CMP ("chemical-mechanical polishing") type to reach the required flatness, so as to be able to continue producing devices under optimum conditions.

Optionally, a layer of a material withstanding the chemical solution intended to dissolve the second oxide encapsulating the movable parts is then deposited 40. Typically, as already mentioned, the solution for dissolving silicon oxide is hydrofluoric acid-based and the protection layer 40 is silicon nitride-based. If this layer does not exist, the step of releasing the movable parts, described hereinunder, will then be a "time step", i.e. based on the known rate of the attack by the solvent of the sacrificial layer.

Optionally, a vertical stop zone aiming at horizontally limiting the release of the movable parts can also be created 45. Again, all the techniques known to the person skilled in the art for creating trenches, which shall have to be filled with a protective material, which can be the same as the one used for the layer 40, may be used. More generally, the invention does not require a particular method to be implemented to obtain the structure described in FIG. 2.

The invention also makes no assumptions on the type of devices which may be produced with the first implementation based on the utilisation of polycrystalline silicon for mechanical parts. Additional layers 250 of various materials used in the microelectronics industry may have been deposited, the patterns of which shall be defined, as above, by lithography and etching.

At this stage, after step 51, the initial silicon wafer containing all the devices, including the MEMS, is transferred onto a second support 60 to enable the release of the movable parts. The second support only requires the mechanical qualities required for handling wafers and enabling the bonding on the upper face of the first wafer, the one wherein the devices have been produced. Fixing the second support is executed using known methods and techniques, which make it possible to stack wafers wherein the circuits are partially or totally produced. More particularly, the second support may be another silicon wafer of the same type as the first one 1, and an oxide on oxide bonding technique by molecular adhesion at low temperature can be used. This type of bonding may require the prior deposition of a protective layer for the devices or parts of devices already produced on the surface of the first wafer and a preparation of the surface of the wafers to be assembled 62. However, the invention does not require the second support 60 to be of a particular nature, since its role mainly consists in providing a mechanical support and a protection for the following operations.

The result is an assembly 65 of two wafers. The first wafer is then thinned from the lower face until the rear face 70 of the porous silicon zone 30 is reached. The step of thinning 71 is carried out using techniques known to the person skilled in the art. The thinning may particularly be executed in two sub-steps. A quick removal of silicon is first carried out, which however must guarantee that the porous zones are not touched at all. For example, the greatest part of silicon can be removed by mechanical abrasion or chemically. In a second sub-step, polishing of the CMP type is carried out, as mentioned above, which gives a surface condition and flatness which are satisfactory for the following operations. The stoppage of polishing can be automatically controlled using various known means for detecting porous areas, more particularly optical means, by measuring the reflectivity/absorption of a light source on the surface being polished. As a matter of fact, it quickly varies when the porous zones emerge.

The following step 81 consists in releasing the movable parts by dissolving the silicon oxide of the sacrificial layer encapsulating 80 these. This is executed 84 through the porous silicon zones which have previously been formed on the surface of the first wafer 30, and which became accessible through the lower face upon completion of the thinning operation on the first wafer. The attack of the sacrificial layer will optionally be stopped by the stopping layer 40 and by the stopping zone 45 if either one, or both exist s). If not so, the stoppage will be a "time stop" based on the knowledge of the rate of the attack of the sacrificial layer by the solvent.

The attack chemical solution 82 of the sacrificial layer depends on the material used. In the standard case described hereabove using silicon oxide ($SiO_2$), a solution of hydrofluoric acid (HF) can be used in liquid or gaseous phase. The aqueous solutions may for example be of a pure HF type at various content levels however. They can also be made of a mixture with ammonium fluoride ($NH_4F$). Ready for use chemical solutions are commercially available as for example the 49% diluted hydrofluoric acid which can also be more diluted by the user to control the final content, typically between 0.1% and 49%. Buffered solutions of the BOE ("buffered oxide etchant") type are also available. In fact, they are mixtures of the $NH_4F/HF$ type. $NH_4F$ based only solutions can also be considered. All these solutions have characteristics of silicon oxide attack rate which can be very different and also depend on the type of oxide composing the sacrificial layer: deposited thermal oxide or silicon oxide of the USG "Undoped Silicate Glass" type, chemically deposited in vapour phase from a precursor: silane or deposited oxide of the TEOS "tetra ethyl ortho silicate" type.

The possible impact on the other metallic or semiconductor materials composing the devices to be produced must also be considered to select the chemical solution attacking the sacrificial layer. The control of the stoppage of the etching aiming at releasing the movable parts of the MEMS, and thus the determination of the attack times is of course a key parameter which is a condition for the implementation of the method according to the invention. For example, an attack rate with oxide of the thermal $SiO_2$ type formed at a temperature of 1100° C. of the order of 620 Å/min (1 Å=$10^{-10}$ meter) can be observed for a solution of the BOE type corresponding to a 40% $NH_4F$ and 49% HF mixture in a proportion of seven volumes of $NH_4F$ for one volume of HF. A higher attack rate of the order of 1200 to 2000 Å/min may be observed for an oxide of the USG or TEOS type chemically deposited in vapour phase. For a 1-micron layer of silicon oxide deposited in gaseous phase, approximately 10 minutes are required to dissolve it. The sacrificial layer can also be dissolved in several steps, successively using various etching solutions, whether liquid or gaseous.

More simply, the control of the stoppage of the etching will depend on the estimated time, if, on the one hand the thickness of the surface of the sacrificial layer as well as the material used and, on the other hand, the attack rate of the chemical solution used, are known. In the standard example hereabove with a sacrificial layer of silicon oxide, the attack of the latter is isotropic from the opening defined by the porous silicon as shown at reference number 80 in FIG. 2.

As already mentioned hereabove, additional technological steps can be added to the method for producing barriers 45 (only one is shown) preventing the chemical attack from horizontally propagating, thus ensuring a better control and a greater freedom for the implementation of the step of releasing the movable parts. In addition to silicon nitride ($Si3N4$) mentioned above, materials of the hydrogenated amorphous silicon carbonate type (SiC) and hydrogenated amorphous silicon carbonitrate (SiCN) are well-known to resist an HF attack intended to dissolve silicon oxide about the movable parts. They can be used for executing barriers 45.

It should also be noted that upon completion of the release of the movable parts, the tightness of the devices shall easily be provided by depositing for example a layer of oxide on the lower face of the assembly in order to close all the porous zones.

Figure 3:
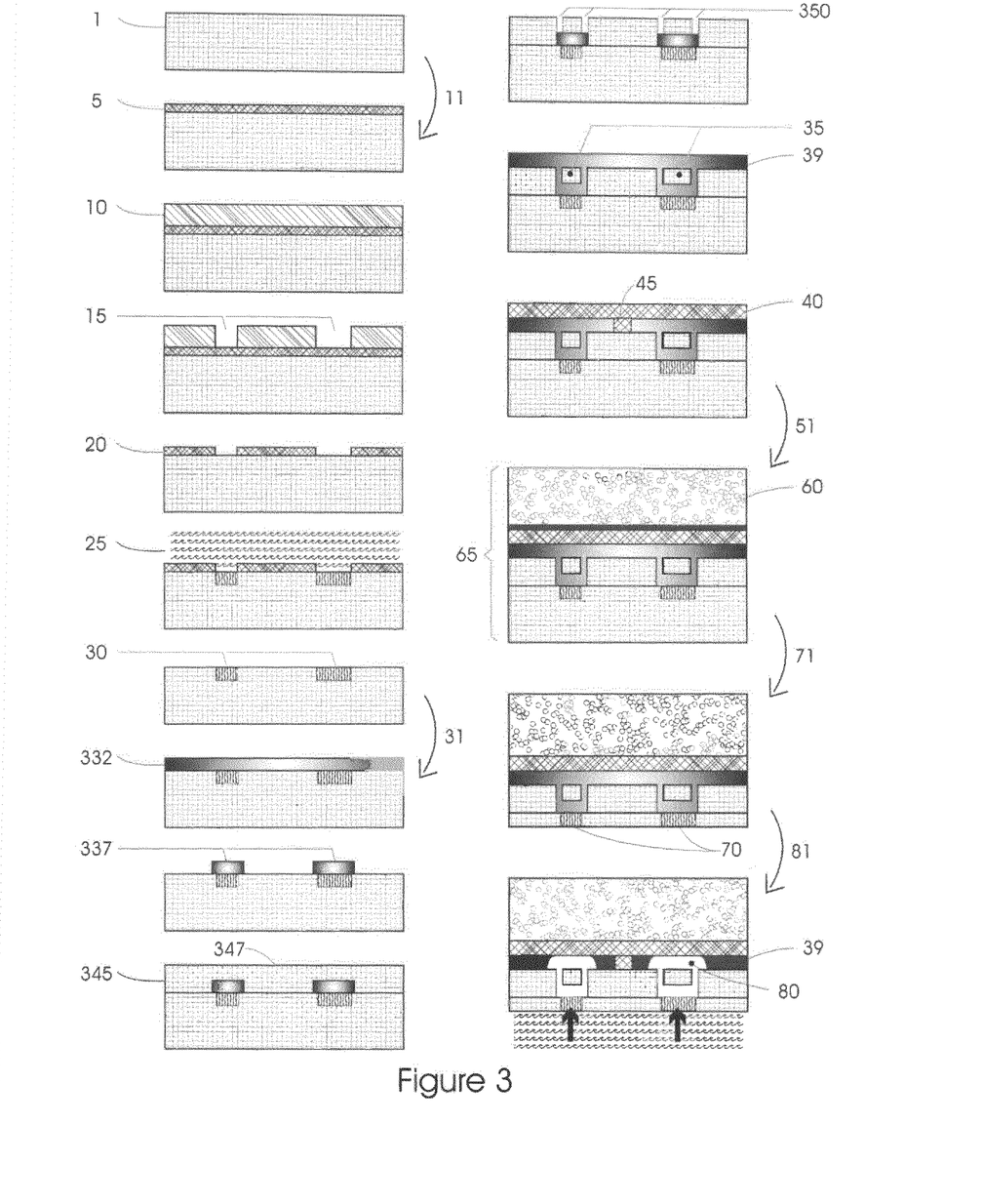
FIG. 3 illustrates a second way to implement the invention, wherein the movable parts made of monocrystalline silicon are also released by the lower face of the device.

FIG. 3 illustrates a second way of implementing the invention wherein the movable parts, this time made of monocrystalline silicon, are also released by the lower face of the device.

The initial step 11 of the method which leads to the formation of porous zones 30 at the surface of the first wafer is strictly identical to that of FIG. 2. Intermediate steps are not otherwise disclosed. They are mentioned again here only for convenience for displaying in the same figure all the steps of this second implementation of the invention.

The following step 31 makes it possible, like FIG. 2, to create mechanical parts. It is different in that it first consists in forming at the surface of the first wafer 1 a layer of monocrystalline silicon wherein electronic components can be made, to produce advantageously, at the same time as MEMS device, particularly logic or analog circuits. For example, complementary field-effect transistors for logical circuits of the CMOS type. In this second implementation of the invention, the mechanical parts are thus advantageously made of monocrystalline silicon too.

For this purpose, a layer of silicon oxide 332 is deposited on the whole surface of the first wafer. Patterns located at the level of the porous zones are etched therein 337 with a traditional method used in microelectronics (deposition of photoresist, photolithography, etching of the oxide, removal of the resin). The movable parts of the MEMS will be formed on these oxide patterns as explained hereinunder. They compose the first part of the sacrificial layer which shall eventually be dissolved for releasing the mobile parts as described above.

Then, a layer of monocrystalline silicon 345 is formed by epitaxy from the zones not protected by the oxide. The epitaxial layer has the same crystalline structure as that of the wafer whereon it is formed. Epitaxy is here executed in a so-called selective way. There is no growth of silicon on the oxide patterns proper, which are however finally coated with the monocrystalline silicon because of the lateral growth which occurs from the adjacent zones. The techniques to obtain the results are known by the persons skilled in the art. More particularly a so-called ELO ("epitaxy lateral overgrowth") technique can be used. A polishing of the CMP type may be necessary to obtain an appropriate surface condition 347 upon completion of this operation.

The following steps consist in creating narrow trenches 350 which are at the border of the oxide patterns 337 in the epitaxial layer of monocrystalline silicon. At this stage, it should be noted that various methods exist for finding the buried patterns of porous silicon 30 covered by the oxide patterns 337 after polishing. For example, using alignment marks which shall have to be uncovered. The principle consists in executing a photolithography and an etching of the cutting tracks making it possible to find the alignment marks of the last level which are buried by the epitaxial layer 345. A rough alignment is first carried out using the flat zone or the positioning cut which exists on each wafer. The marks are then uncovered. Secondly, a fine alignment may be carried out using the marks provided for this purpose for the following levels.

The trenches 350 are then filled with oxide and a deposition is executed which covers the whole surface of the wafer so that the movable zones of the MEMS 35 are totally encapsulated by oxide 39. A new polishing of oxide may be required.

The whole assembly is covered as previously mentioned by a layer 40 of a material withstanding an attack intended to dissolve oxide encapsulating the movable parts. As previously, and under the same conditions, a vertical stoppage zone for limiting horizontally the release of the movable parts may optionally also be created 45. Solutions for the attack and the materials which may be used have already been mentioned in the description of FIG. 2.

All the following steps up to the release of the movable parts are also identical. The transfer 51 onto a second wafer 60 is executed under the same conditions as in FIG. 2 to obtain the assembly 65. A thinning 71 and a polishing of the lower face 70 are carried out to show the porous zones and then the release 81 of the movable parts can occur as previously mentioned. It should be noted that with this structure using monocrystalline silicon the dissolution of oxide is laterally limited by the epitaxial layer and can only occur in the thin upper layer of oxide of the sacrificial layer 39 which contributes to a better control of the step of releasing the movable parts 80. The formation of the stoppage zones 45 is optional.

Figure 4:
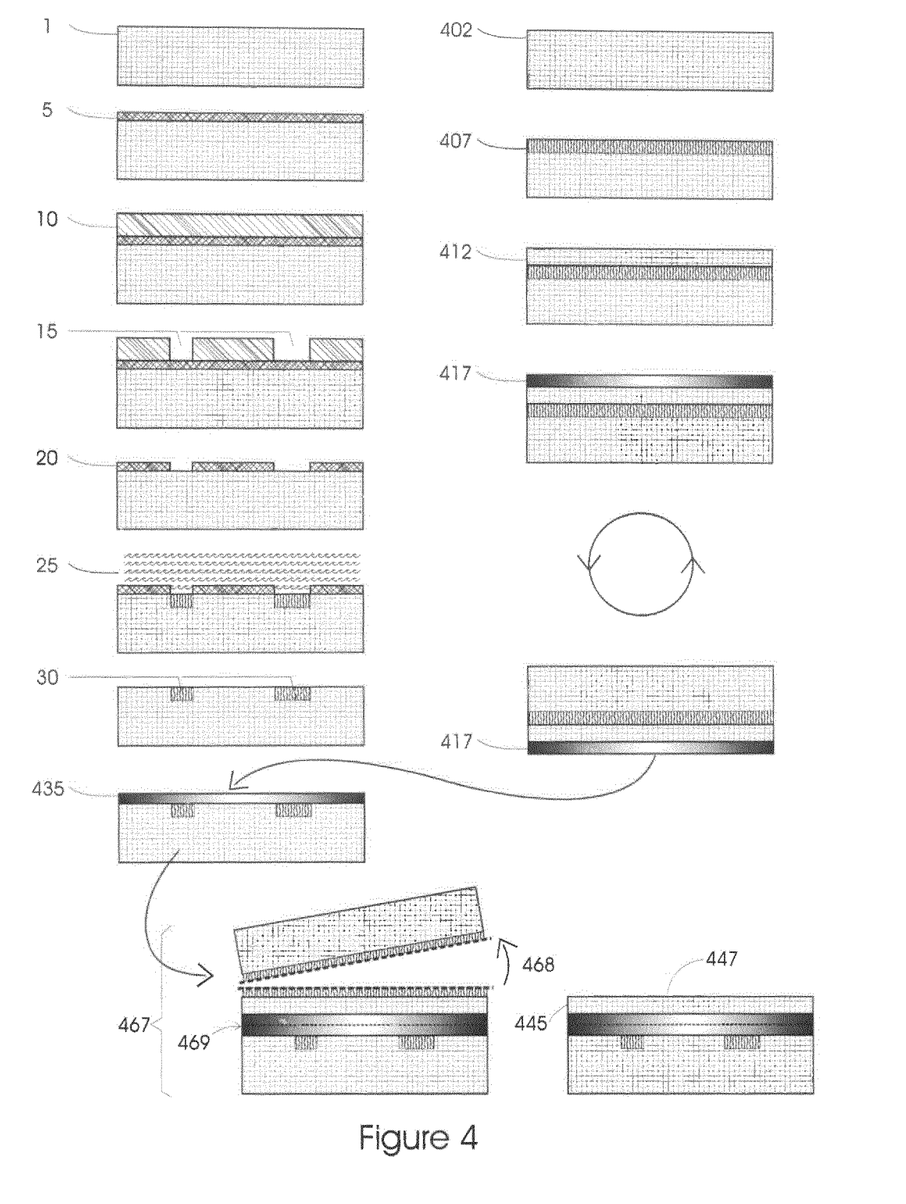
FIG. 4 illustrates an alternative implementation of the method of the invention, which also makes it possible to obtain a layer of monocrystalline silicon, wherein electronic devices and MEMS can be manufactured.

FIG. 4 illustrates an alternative implementation of the method of the invention which also makes it possible to obtain a layer of monocrystalline silicon wherein electronic devices and MEMS can advantageously be simultaneously produced. The movable parts of the MEMS are released as disclosed in FIGS. 2 and 3.

The method here consists in obtaining, as previously, a first wafer of monocrystalline silicon wherein porous zones have been created 30. The steps of the method 1 to 30 which lead to the formation of porous zone on the surface of the first wafer are strictly identical to the equivalent ones in FIG. 2 and are not otherwise described.

A second wafer of monocrystalline silicon 402, for example of the same type as the one whereon the porous zones have been formed is used. A porous layer 407 is then created on the whole surface thereof. The formation of the porous layer is carried out under the same conditions as those described in FIG. 2 except for the fact that no lithography and etching operation on a protective material is required since the porous silicon this time covers the whole surface. This operation is followed by the formation, by epitaxial growth, of a layer of monocrystalline silicon 412 from the porous silicon layer 407. The epitaxy conditions are different however from those currently used on massive silicon. More particularly, upon completion of the porous silicon, a first heat treatment under vacuum is applied in order to stabilise the morphology of the porous silicon before carrying out an epitaxy.

A deposition of silicon oxide is then carried out on the whole surface 417 with a view to assembling, after turning, the first wafer 1 whereon zones of porous silicon have been formed 30. The first wafer receives a deposition of oxide on the whole surface 435 with a view to bonding the two wafers to form an assembly 467. As already examined, a technique of oxide on oxide bonding by molecular adhesion at low temperature 469 can be used. Other methods are known to the persons skilled in the art and can also be used in order to produce the assembling of both substrates.

In order to leave only a thin layer of monocrystalline silicon on the surface wherein the electronic components can be produced, more particularly logic and analog circuits together with MEMS devices, making a fracture 468 at the level of the layer of porous silicon of the second wafer is known. The remaining part of the wafer can then be reused.

It is also possible to use a mechanical and chemical abrasion, for example in two steps as described in FIG. 2. Polishing of the CMP type makes it possible to stop the thinning upon detection of the end of the porous zone.

Polishing of the CMP type must any way be provided to find the epitaxial layer of the monocrystalline silicon 445 and a correct surface condition 447 in both cases. In order to enable the positioning of the following operations, the buried patterns of porous silicon can be found after polishing as has already been described while referring to FIG. 3.

At this stage, the assembling of both substrates is similar to the one obtained in FIGS. 3 (345 and 347). All the following steps, from step 350, can then be applied under the same conditions. The only difference is that two continuous layers of silicon oxide encapsulating the movable parts (instead of only one with the method described in FIG. 3) exist. The control of the release of the movable parts is not significantly affected. In this alternative solution of the second embodiment of the invention described in FIG. 3, which makes it possible to obtain a layer of monocrystalline silicon, three wafers are used finally, one of which can be reused.

The invention reaches the objectives fixed although it does not use sophisticated wafers of the SOI type which are expensive. It also makes it possible for the release of the movable parts to be carried out by the lower or rear face of the first wafer when the electronic and mechanical components are protected because of their transfer onto the second wafer. The second wafer is then used as a mechanical support and is a very efficient protection for all the devices already produced on the surface of the first wafer.

The invention claimed is:

1. A method for producing an electro-mechanical microsystem including movable mechanical parts, said method including a phase of releasing at least one movable mechanical part, wherein the releasing phase includes the following steps:
   forming at least one porous zone in a first wafer of a semiconductor material;
   forming at least a pattern of a material that makes at least one movable mechanical part on a front face of the first wafer and at least a partial encapsulation of the pattern in a sacrificial layer;
   releasing the movable mechanical part through a rear face of the first wafer throughout the porous zone, using a solvent of the sacrificial layer.

2. A method according to claim 1, wherein a layer of a material withstanding an attack by a solvent of the sacrificial layer is deposited above the sacrificial layer.

3. A method according to claim 1 or 2, wherein prior to releasing the movable mechanical part:
   bonding the front face of the first wafer onto a second wafer (60); and
   thinning from the rear face of the first wafer until the porous zone is detected.

4. A method according to claim 3, wherein the material that makes the movable mechanical part is monocrystalline silicon.

5. A method according to claim 4, wherein the monocrystalline silicon is obtained by a selective epitaxial growth from the first wafer, which is also made up of monocrystalline silicon.

6. A method according to claim 5, wherein at least one oxide pattern is formed on the porous zone, said oxide pattern belonging to the sacrificial layer, and the epitaxial growth is so executed as to cover the oxide pattern.

7. A method according to claim 5, wherein at least one trench filled with oxide is formed orthogonally to the porous zone, followed by a deposition of oxide on a whole surface of the first wafer so as to make up, with the pattern or a layer of oxide previously formed on the porous zone, the sacrificial layer encapsulating the movable mechanical part.

8. A method according to claim 4, wherein the monocrystalline silicon is obtained by transfer of an epitaxial layer formed on a third wafer of monocrystalline silicon after a formation of a layer of porous silicon on the surface thereof.

9. A method according to claim 8, wherein a deposition of an oxide layer is made on the first wafer upon completion of the forming of the porous zone and a deposition of oxide is made on the third wafer upon completion of the formation of the epitaxial layer for the assembling thereof by bonding.

10. A method according to claim 9, wherein the method further includes fracturing the third wafer at the level of the layer of porous silicon and polishing, so as to leave a continuous layer of monocrystalline silicon at a surface of the first wafer.

11. A method according to claim 4, wherein the method includes producing at least one electronic component of the electro-mechanical microsystem in the layer of monocrystalline silicon.

12. A method according to claim 1, wherein the sacrificial layer covers at least partially the porous zone.

13. A method according to claim 12, wherein the sacrificial layer is interrupted by at least one barrier able to define at least partially one zone to be released about the movable mechanical part, said barrier being made of a material withstanding an attack by a solvent of the sacrificial layer.

14. A method according to claim 1, wherein the sacrificial layer is made of an oxide of the semiconductor material making up the first wafer.

15. A method according to claim 1, wherein the material that makes the movable mechanical part is polycrystalline silicon.

16. A method according to claim 1, wherein the method includes producing electronic components participating in the electro-mechanical microsystem above a layer of a material withstanding an attack by a solvent of the sacrificial layer.

17. A method according to claim 1, wherein the method includes depositing, onto a rear face opposite the front face of the first wafer, a material able to make the electro-mechanical microsystem tight by obstruction of the porous zone.

18. A method according to claim 1, wherein at least one several porous zones or several patterns of movable mechanical parts are formed.

* * * * *